US009656618B2

(12) United States Patent
Guering et al.

(10) Patent No.: US 9,656,618 B2
(45) Date of Patent: May 23, 2017

(54) ELECTRICAL CABINET OF AN AIRCRAFT INCORPORATING AN IMPROVED ELECTRICAL CONNECTION SYSTEM

(71) Applicant: AIRBUS OPERATIONS S.A.S., Toulouse (FR)

(72) Inventors: Bernard Guering, Montrabe (FR); Yves Durand, Aussonne (FR)

(73) Assignee: AIRBUS OPERATIONS S.A.S, Toulouse (FR)

( * ) Notice: Subject to any disclaimer, the term of this patent is extended or adjusted under 35 U.S.C. 154(b) by 560 days.

(21) Appl. No.: 14/227,356

(22) Filed: Mar. 27, 2014

(65) Prior Publication Data

US 2014/0210258 A1 Jul. 31, 2014

Related U.S. Application Data

(63) Continuation of application No. PCT/FR2012/052139, filed on Sep. 25, 2012.

(30) Foreign Application Priority Data

Sep. 30, 2011 (FR) ...................... 11 58827

(51) Int. Cl.
*B60R 16/03* (2006.01)
*H05K 7/14* (2006.01)
*B60R 16/02* (2006.01)

(52) U.S. Cl.
CPC .......... *B60R 16/03* (2013.01); *B60R 16/0207* (2013.01); *H05K 7/1439* (2013.01); *H05K 7/1449* (2013.01)

(58) Field of Classification Search
CPC ...................................... B60R 16/03

USPC ......................................... 307/9.1
See application file for complete search history.

(56) References Cited

U.S. PATENT DOCUMENTS

| 5,376,011 | A | 12/1994 | Rudy, Jr. et al. |
| 6,394,815 | B1 | 5/2002 | Sarno et al. |
| 7,547,845 | B2 | 6/2009 | Azemard |
| 8,035,985 | B2 | 10/2011 | Nemoz et al. |

FOREIGN PATENT DOCUMENTS

EP 2330879 A1 6/2011

OTHER PUBLICATIONS

International Searching Authority, International Search Report for PCT/FR2012/052139 Mailed Jan. 7, 2013.

*Primary Examiner* — Joseph Chang
(74) *Attorney, Agent, or Firm* — Lorenz & Kopf, LLC

(57) ABSTRACT

An electrical cabinet of an aircraft is provided. The electrical cabinet includes at least one motherboard including on a first face sockets into which are plugged PCB boards ensuring one or more electrical functions, the said electrical cabinet being linked to the electrical circuit of the aircraft organized as various electrical harnesses by way of an electrical connection system, characterized in that the electrical connection system comprises at the level of the second face of the motherboard at least one additional layer, the free face of the last additional layer comprising sockets each ensuring electrical connection with an electrical harness of the aircraft, the additional layer or layers comprising tracks which make it possible to reorganize the electrical circuits emanating from the sockets intended for the PCB boards so as to render them compliant with the sockets intended for the harnesses of the aircraft.

8 Claims, 5 Drawing Sheets

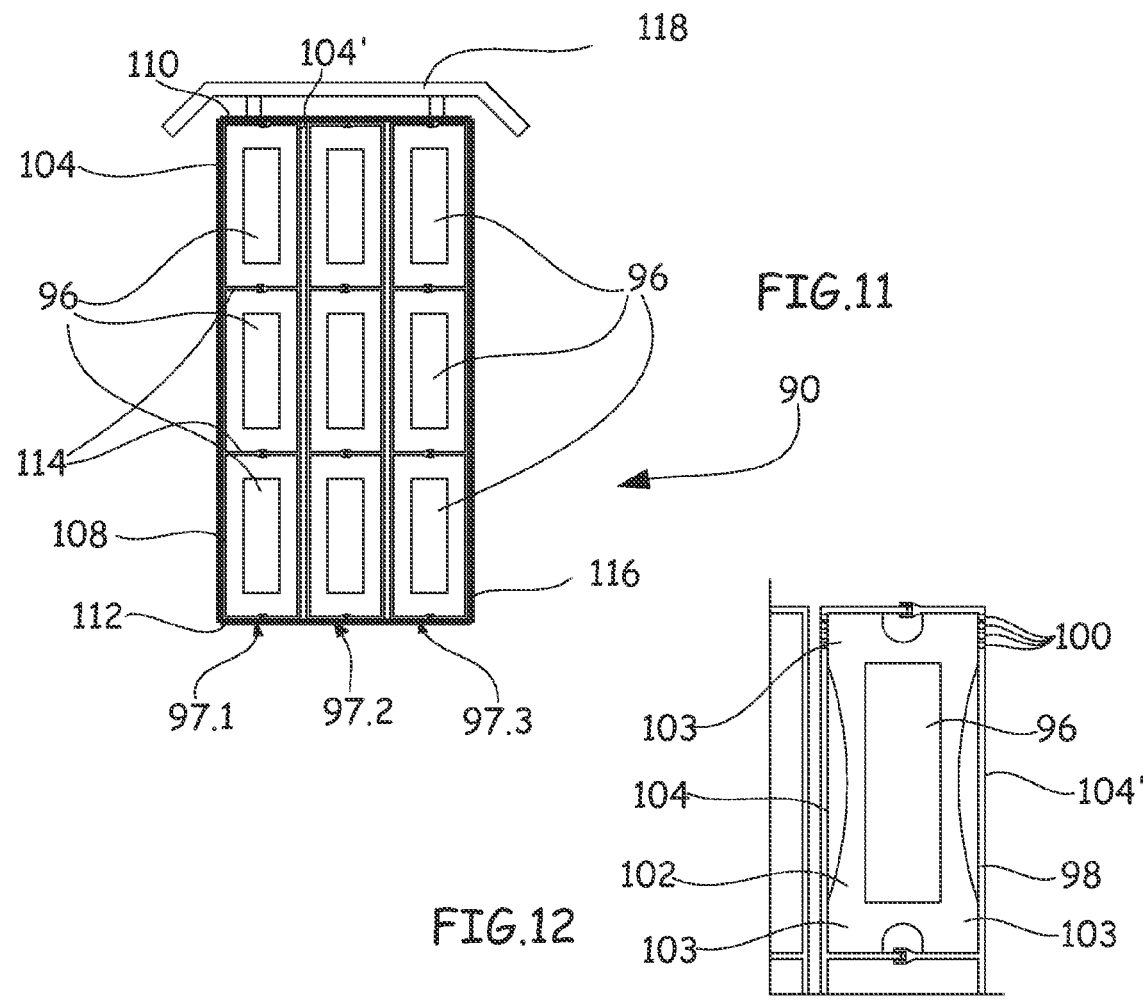
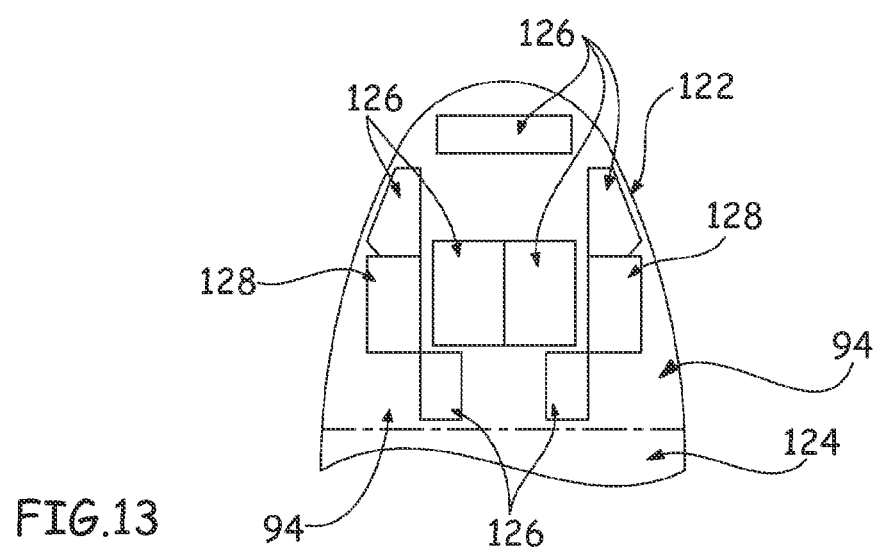

ELECTRICAL CABINET OF AN AIRCRAFT INCORPORATING AN IMPROVED ELECTRICAL CONNECTION SYSTEM

CROSS-REFERENCE TO RELATED APPLICATIONS

This is a continuation of International Application No. PCT/FR2012/052139, filed Sep. 25, 2012, which application claims priority to French Application No. 11 58827, filed Sep. 30, 2011, which are each incorporated herein by reference in their entirety.

TECHNICAL FIELD

The technical field pertains to an electrical cabinet of an aircraft incorporating an improved electrical connection system.

BACKGROUND

As illustrated in FIG. 1, a civil aeroplane comprises a cabin 10 with a nose cone 12 in the nose, containing in particular a cockpit and an avionics bay. This nose cone 12 comprises numerous electrical cabinets 14 which are tending to occupy more and more room having regard to the growing needs in respect of electrical functions. These electrical cabinets 14 are generally situated in the avionics bay. However, some may also be integrated into the cockpit. In this case, the electrical cabinets must share the space with the other elements of the cockpit. Hence, it is necessary for these cabinets to be relatively compact and for it to be possible to link them to the remainder of the electrical circuit of the aircraft under good conditions for the operators who have to share this restricted space with other operators responsible for mounting other elements in the cockpit.

Regarding the electrical network of the aircraft, the latter is organized as electrical harnesses grouping together several electrical cables because of safety-related production and segregation issues of concern. These electrical harnesses run in the nose cone so that the electrical cables are linked to the electrical cabinets.

According to a known embodiment, illustrated in FIG. 2, in accordance with the Arinc 600 standard, an electrical cabinet 14 comprises several modules 16 distributed over several shelves (a single one is represented in FIG. 2).

Each module 16, associated with one or more electrical functions, comprises at least one input cable 18 and at least one output cable 20 and at least one component making it possible to handle the electrical signal between the input cable 18 and the output cable 20. The expression "handling the electrical signal" is understood to mean any action on the said signal, namely either a modification or simple checking or reading.

The input cables 18 and the output cables 20 are organized and grouped into lanes 22.1 to 22.4 inside the cupboard so as to be in phase with the electrical harnesses of the aircraft.

The electrical cabinet 16 comprises at the level of each of its vertical sides isolator panels 24 at the level of which are provided means for connection between the lanes 22.1 to 22.4 of the electrical cabinet and the harnesses 26.1 to 26.4 of the electrical circuit of the aircraft.

In the rear part of the cabinet, there are also cables ensuring electrical linking between two modules of one and the same shelf or of different shelves. In the latter case, the electrical cables can be grouped together in the form of electrical harnesses 28 which extend over at least a part of the height of the cabinet at the level of its rear part.

This design leads to bulky cabinets with a relatively low density of components.

In the avionics sector, there is another standard termed IMA (Integrated Modular Avionics) which proposes that the modules be placed as close as possible to the needs, thereby leading to a non-centralized architecture as in the case of the Arinc 600 standard but positioned throughout the aircraft. According to this new standard illustrated in FIGS. 3 and 4, the electrical functions take the form of boards 30 also called PCB boards grouped together in a box 32 comprising a chassis with a motherboard 34 at the rear into which the PCB boards 30 are plugged. This motherboard 34 comprises ports 36 making it possible to link input or output cables 38.

These cables 38 are thereafter organized and grouped into lanes so as to be in phase with the electrical harnesses of the aircraft. The lanes of cables 38 are connected to the electrical harnesses 40 of the aircraft at the level of isolator panels 42.

This type of architecture makes it possible to obtain a more compact assembly in so far as the PCB boards 30 make it possible to link, without any cable, the components necessary for ensuring the functions.

In addition, the motherboard 34 can comprise circuits making it possible to ensure the link between the PCB boards 30 of one and the same box 32, thereby tending to dispense with certain cables relative to the architecture of Arinc 600 type.

However, when two PCB boards 30 supported by different motherboards must be electrically linked, it is necessary to make provision for an electrical cable which travels via the electrical harnesses of the circuit of the aircraft.

According to another drawback, if these elements are arranged in the form of a cabinet and if each motherboard 34 corresponds to a shelf then such a cabinet comprises as previously a zone 44 where the cables 38 are organized and grouped into lanes so as to be in phase with the electrical harnesses of the aircraft, thereby tending to increase the volume of the cabinet and preventing optimization of the density of the components.

In the same regard, for certain electrical cabinets called electrical cores 46 (visible in FIG. 1), it is necessary to make provision for sufficient space at the rear to be able to link generating cables 48.1 to 48.3 by way of lugs, as is illustrated in FIG. 5. These cables which extend from the motorizations to the electrical core have significant cross-sections having regard to the electrical powers transferred, these cross-sections being all the more significant as they are made of aluminium alloy for a weight saving. Because of their significant cross-sections and their stiffnesses, these cables need a significant radius of curvature and have difficulty running in a restricted volume.

As illustrated in FIG. 6, the generating cables 48.1 to 48.3 comprise for each phase at least two conductors, thereby tending to increase their stiffnesses.

Having regard to the stiffnesses of the cables and the lack of precision of their positionings, the segregation distance L (also called guard) between the cables is significant, thereby going counter to a run in a restricted volume.

According to another issue of concern, the floor at the rear of the electrical core 46 is not flat and follows the profile of the fuselage, thereby rendering the connection of the generating cables more difficult.

In addition, other objects, desirable features and characteristics will become apparent from the subsequent summary and detailed description, and the appended claims, taken in conjunction with the accompanying drawings and this background.

SUMMARY

Hence, the present disclosure is aimed at alleviating the drawbacks of the prior art by proposing a new electrical cabinet architecture which integrates a system for connection with the remainder of the circuit of the improved aircraft.

For this purpose, the various teachings of the present disclosure provides an electrical cabinet of an aircraft comprising at least one motherboard comprising on a first face sockets into which are plugged PCB boards ensuring one or more electrical functions, the said electrical cabinet being linked to the electrical circuit of the aircraft organized as various electrical harnesses by way of an electrical connection system, characterized in that the electrical connection system comprises at the level of the second face of the motherboard at least one additional layer, the free face of the last additional layer comprising sockets each ensuring electrical connection with an electrical harness of the aircraft, the additional layer or layers comprising tracks which make it possible to reorganize the electrical circuits emanating from the sockets intended for the PCB boards so as to render them compliant with the sockets intended for the harnesses of the aircraft.

A person skilled in the art can gather other characteristics and advantages of the disclosure from the following description of exemplary embodiments that refers to the attached drawings, wherein the described exemplary embodiments should not be interpreted in a restrictive sense.

BRIEF DESCRIPTION OF THE DRAWINGS

The various embodiments will hereinafter be described in conjunction with the following drawing figures, wherein like numerals denote like elements, and wherein:

FIG. 11 is a transverse cut of an extension of an electrical core;

FIG. 12 is a transverse cut illustrating details of an extension of an electrical core; and FIG. 13 is a schematic representation of an example of integration of electrical cabinets in a cockpit of an aircraft by virtue of the arrangements of the cabinets according to the various teachings of the present disclosure.

DETAILED DESCRIPTION

The following detailed description is merely exemplary in nature and is not intended to limit the present disclosure or the application and uses of the present disclosure. Furthermore, there is no intention to be bound by any theory presented in the preceding background or the following detailed description.

Figure 1:
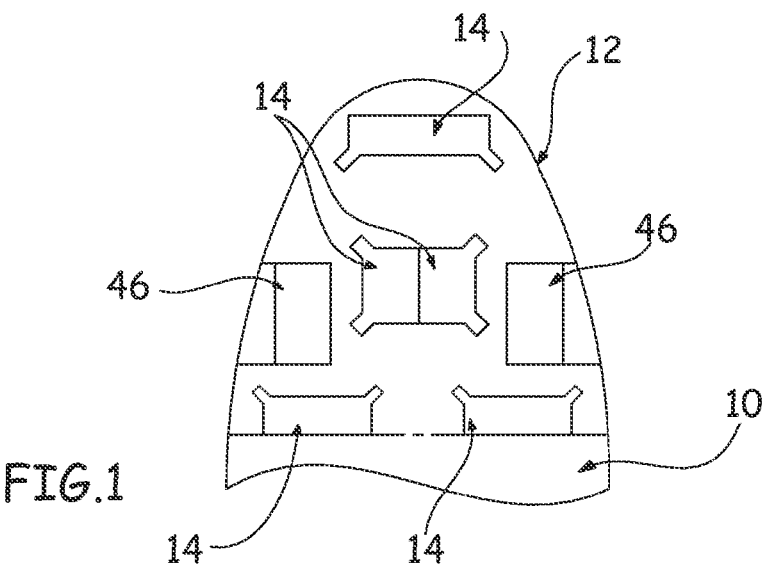
FIG. 1 is a schematic view from above illustrating in a schematic manner electrical cabinets according to the prior art at the level of a nose cone of an aircraft.
Figure 2:
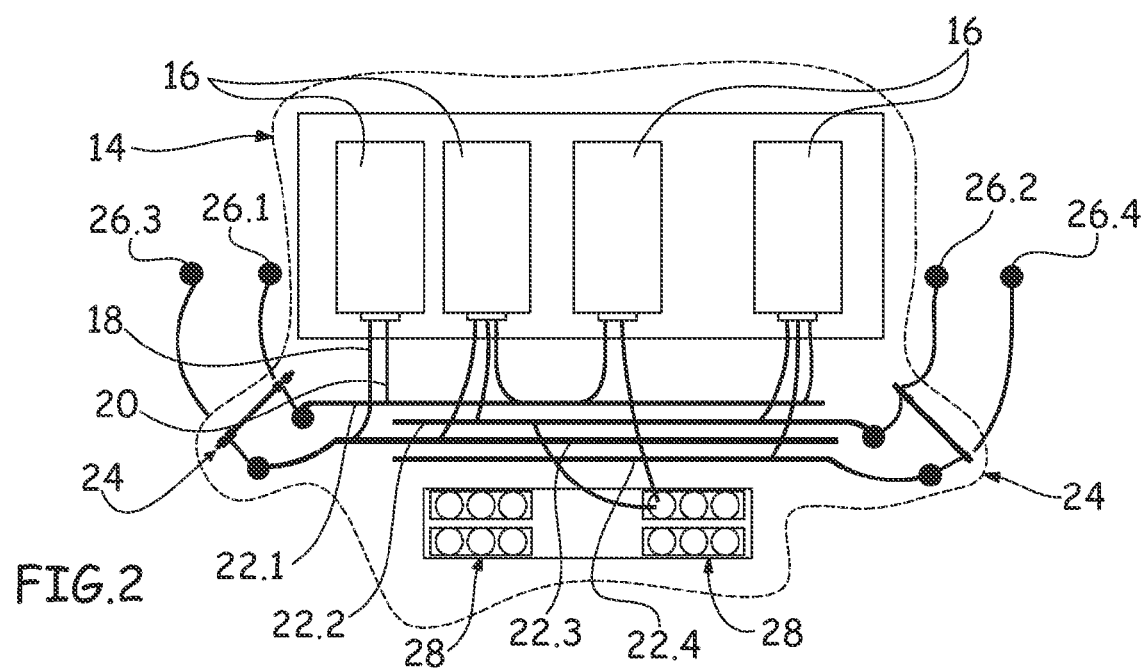
FIG. 2 is a schematic representation of an electrical cabinet according to a first variant of the prior art.
Figure 3:
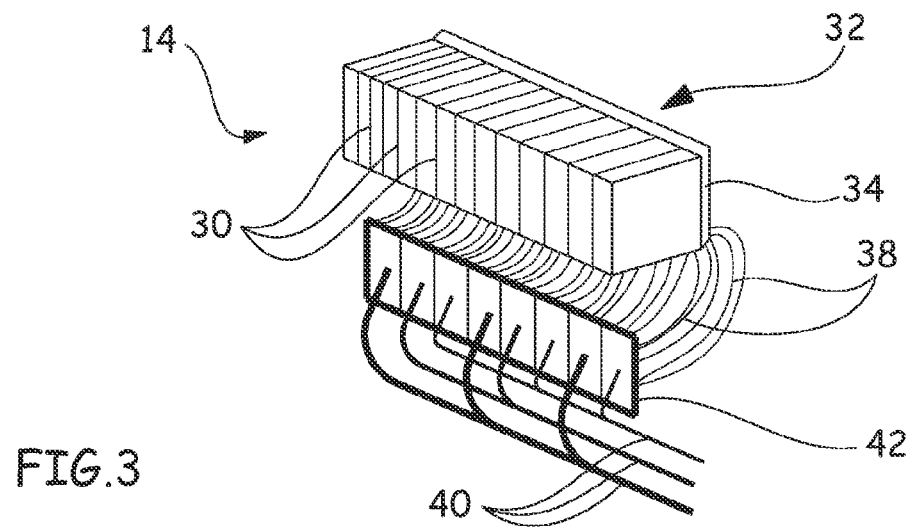
FIG. 3 is a schematic view in perspective of an electrical cabinet according to a second variant of the prior art.
Figure 4:
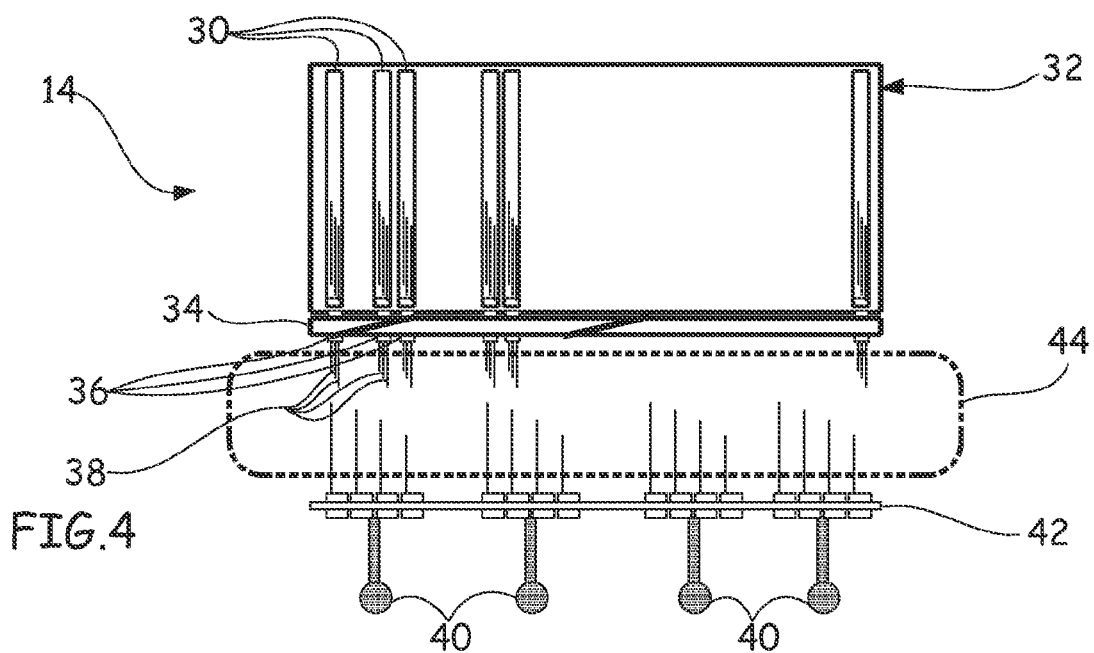
FIG. 4 is a schematic representation of an electrical cabinet according to the second variant of the prior art.
Figure 5:
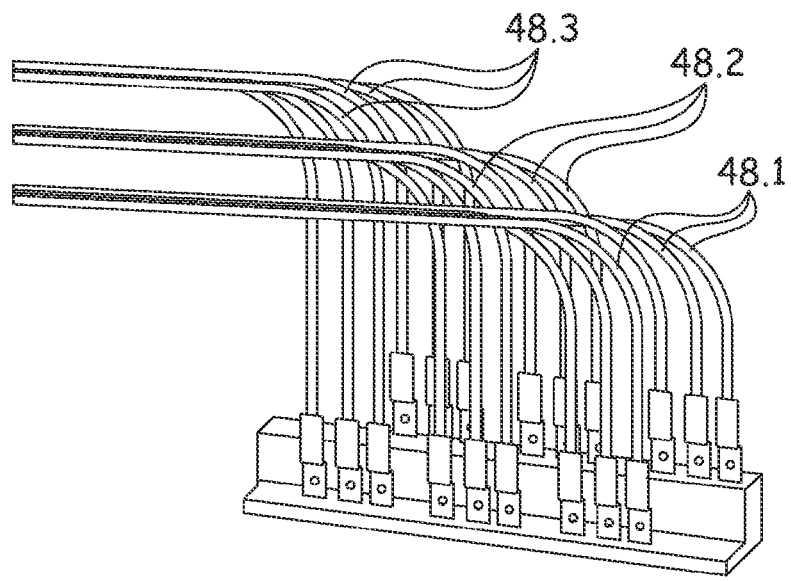
FIG. 5 is a view of a part of the rear of an electrical core according to the prior art illustrating the connection of generating cables.
Figure 6:
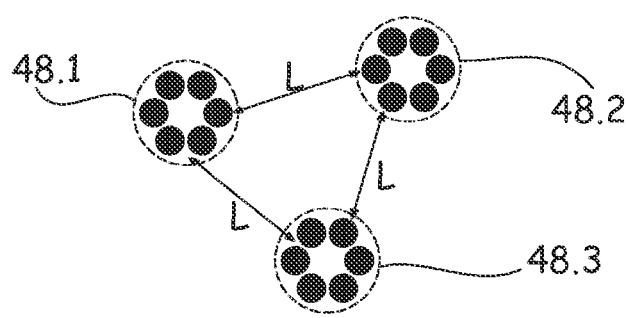
FIG. 6 is a cut illustrating the generating cables and their spacing.
Figure 7:
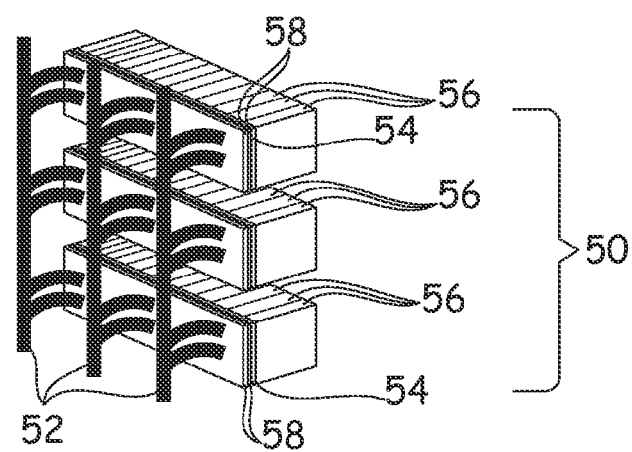
FIG. 7 is a schematic view in perspective of an electrical cabinet according to the various teachings of the present disclosure.
Figure 8:
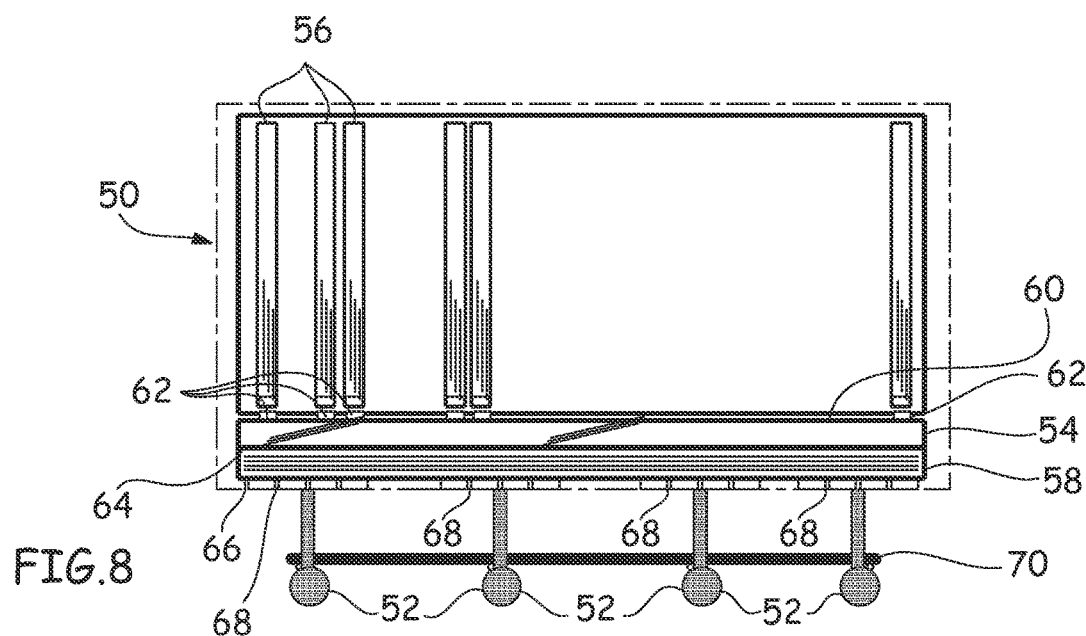
FIG. 8 is a schematic representation of the electrical cabinet according to the various teachings of the present disclosure.

In FIGS. 7 and 8, an electrical cabinet according to the various teachings of the present disclosure has been represented at 50, and which must be linked to the electrical circuit of the aircraft organized as various electrical harnesses 52.

For the present application, the expression electrical cabinet is intended to mean either a cabinet comprising electrical elements, or a cabinet comprising electronic elements or a cabinet comprising electrical and electronic elements.

An electrical cabinet 50 comprises a support to which may be attached several motherboards 54 (three in the example) disposed substantially vertically one above another, each corresponding to a shelf PCB boards 56 are plugged into the motherboards 54.

According to a simplified variant, an electrical cabinet may comprise a single motherboard 54.

Each PCB board 56 corresponds to one or more electrical functions. The PCB boards 56 and the motherboards 54 are not described further since they are known to the person skilled in the art, and correspond to the IMA standard. In contradistinction to this standard, the motherboards 54 are not distributed in the aircraft but grouped together in an electrical cabinet.

According to one embodiment, each motherboard 54 comprises at least one additional layer 58 comprising electrical tracks making it possible to reorganize the electrical outputs of the motherboard 54 and of its additional layer or layers so as to be in phase with the electrical harnesses of the aircraft.

As illustrated in FIGS. 7 and 8, each motherboard 54 comprises at the level of a first face 60 sockets 62 making it possible to plug in the PCB boards 56. On this first face 60 or on its second face 64, each motherboard 54 comprises electrical tracks ensuring connections between the PCB boards 56 of one and the same motherboard 54.

Each motherboard 54 comprises at the level of its second face 64 at least one additional layer 58, the free face 66 of the last additional layer comprising sockets 68 each ensuring electrical connection with an electrical harness of the aircraft.

This or these additional layers 58 comprise tracks which make it possible to reorganize the electrical circuits emanating from the sockets 62 intended for the PCB boards 56 so as to render them compliant with the sockets 68 intended for the harnesses of the aircraft in relation to the problems of segregation and safety of the electrical lanes making up the harnesses.

The superposition of additional layers makes it possible to cross the tracks without electrical contact between the tracks of the various layers. Thus, the number of additional layers not being limited, it is possible to increase the segregations and the redundancies in a very restricted volume.

According to another advantage, it is possible to dispense with the isolator panels of the electrical cabinets according to the Arinc 600 standard.

Dispensing with the cables inside the electrical cabinet makes it possible, for equal volume, to integrate many more components and therefore many more electrical functions.

The harnesses of the aircraft can be reorganized as a function of this novel architecture of the electrical cabinets.

As a supplement to the electrical cabinets, rails 70 are provided at the rear of the cabinets to hold the electrical harnesses vertically but also cables ensuring interconnection between two motherboards 54 of one and the same cabinet. According to one embodiment each rail takes the form of a rigid rod with a diameter for example of the order of about 8 mm which is linked to the various harnesses and which comprises fixing claws for fixing it to the aircraft or to any other element present in the aircraft. In one example, the rails are linked to the harnesses after the latter are made outside the aircraft and thus make it possible to hold the harnesses in their respective positions while the harnesses are being fitted in the aircraft.

Figure 9:
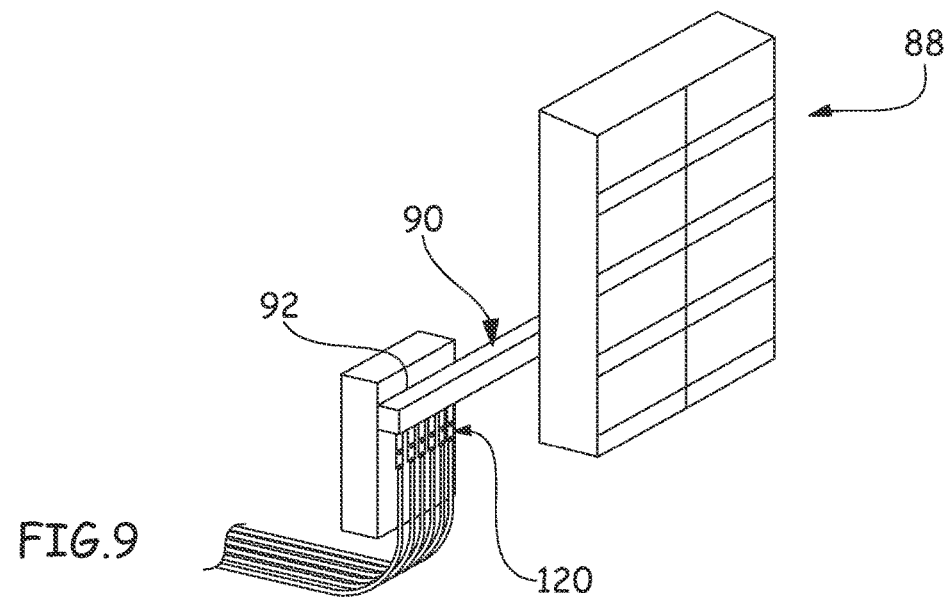
FIG. 9 is a perspective view illustrating an extension of an electrical core according to the various teachings of the present disclosure.
Figure 10:
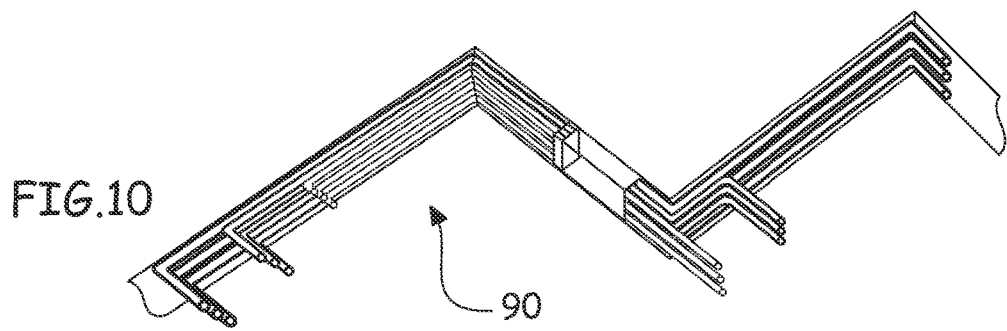
FIG. 10 is a perspective view illustrating in a schematic manner an extension of an electrical core according to the various teachings of the present disclosure.

According to one embodiment, the generating cables originating in particular from the generators of the engines are not linked directly to the rear face of an electrical core 88 but at the level of at least one extension 90 which extends from the rear of the electrical core to a connection panel 92 offset with respect to at least one of the sides of the said electrical core, as illustrated in FIGS. 9 and 10. Thus, it is not necessary to provide for a significant space between the rear face of the electrical core and the wall of the fuselage to ensure the connection of the generating cables.

Advantageously, the connection panel 92 is disposed in a zone 94 corresponding to a lateral connection centre visible in FIG. 13.

This zone 94 is more accessible than the zone situated at the rear of the electrical core and offers a flat floor which improves the working conditions of the operators responsible for industrialization or maintenance.

According to the various teachings of the present disclosure, the extension comprises for each phase of each generating line a copper electrical conducting element 96.

In the subsequent description, copper is intended to mean either copper or a copper alloy.

The extension 90 constitutes an integral part of the electrical core 88. Consequently, volume saving taking priority over weight saving, it is possible to provide just a single conducting element with a significant cross-section per phase for each generating line in contradistinction to aluminium alloy generating cables which comprise at least two conducting elements with a smaller cross-section per phase so as to limit the heating of the conducting elements.

By way of example, nine electrical conductors, three phases for three generating lines 97.1, 97.2 and 97.3, have been represented in FIG. 11.

By using copper instead of an aluminium alloy as material, the conducting elements 96 are afforded a more significant bending ability with bending radii of the order of about 1 millimeter (mm) to about 2 mm possible.

According to another advantage, copper has a lower thermal expansion than the aluminium alloys used to make the generating cables according to the prior art.

According to one embodiment, the conducting elements 96 are rigid and each take the form of a copper rigid bar.

By providing rigid elements, the guard between each conducting element can be reduced.

According to one embodiment, each conducting element 96 is disposed in a rigid conduit 98 made of an electrically insulating material, the rigid conduit 98 having a sufficient cross-section so that the conducting element is separated from the interior face of the conduit by an air gap concentric with the conducting element 96.

This air gap also promotes the cooling of the conducting elements 96. According to one embodiment, in so far as each rigid conduit 98 communicates with the interior of the electrical core and that the interior of the latter is ventilated by forced ventilation, a forced air stream is produced inside each conduit 98. According to one embodiment, orifices 100 (visible in FIG. 12) are made regularly on each conduit 98 to further improve the ventilation of the conducting elements 96.

Advantageously, pads 102 are provided inside the conduit 98, distributed at regular intervals, to maintain the separation right around the conducting element 96.

According to one embodiment, these pads 102 are made of silicone. Each pad comprises a central orifice whose cross-section is tailored to that of the conducting element 96 and at the level of its periphery protuberances 103 whose exterior shapes are tailored to the cross-section of the conduit 98. Between the protuberances 103, the air can circulate along the conduit 98.

These pads 102 also ensure vibratory filtering.

According to one embodiment, the conducting elements have a rectangular cross-section and comprise an insulating surface protection. The rigid conduits 98 also have a rectangular cross-section.

Advantageously, a rigid conduit 98 comprises two assembled half-shells 104, 104'.

According to one embodiment, the half-shells are approximately symmetric in relation to a, generally vertical, median plane 106. Each half shell comprises a first lateral wall 108, an upper wall 110 and a lower wall 112 that are substantially perpendicular to the lateral wall 108 as well as two partitions 114 that are substantially perpendicular to the lateral wall 108 and are distributed in a regular manner between the upper 110 and lower 112 walls.

The free edges of the upper and lower walls as well as of the partitions of the half-shells have shapes which cooperate to ensure the link between the two half-shells. In one example, the two half-shells 104 and 104' are identical and assembled head-to-tail. Thus, according to one embodiment, the free edges of the upper wall and of one of the two partitions comprise slots able to receive the free edges of the other half-shell.

According to the various teachings of the present disclosure, the phases of a generating line are mutually insulated by being disposed in the conduits 98 formed by two assembled half-shells 104 and 104'. The generating lines are mutually insulated by being disposed in different suites of half-shells. Thus, for three generating lines, three suites of two half-shells are provided, a space being made between the suites of two half-shells.

The three suites of half-shells are held assembled by a holding flange 116. Thus, the extension 90 has a substantially rectangular cross-section.

In one example, a deflector 118 is provided above the set of conduits 98 to protect them from dripping liquid.

In one example, the extension 90 comprises at each end of each conducting element a differential-protection device such as for example a coil of Hall-effect type.

From the standpoint of connectability, the end of each conducting element is linked to the electrical core by a power contact, for example by a connection of large cross-section male/female "coupler" type. The other end of each conducting element is linked to the corresponding conducting element of one of the generating cables, at the level of the connection panel, by a connection of terminal strip type 120.

Even though copper has a low expansion coefficient, it is generally desirable to provide means for absorbing the length variations of the conducting elements 96.

In this sense, the means of connection between the conducting elements of the generating cables and the conducting elements of the generating lines of the extension are mounted floating on the connection panel 92.

As a variant or as a supplement, the extension 90 comprises a Z-profile along its length with about a 90° double bend so as to absorb the length variations of the conducting elements because of expansion phenomena.

The improved connection systems of the different variants of the present disclosure make it possible to be able to group the electrical cabinets together in a more restricted space. Thus, it is possible to integrate the whole of the electrical equipment customarily disposed in the bay provided under the cockpit in the volume of the cockpit by making it share the space with the other elements normally present in the said cockpit, as illustrated in FIG. 13.

Thus, in a cockpit 122 disposed at the nose of a cabin 124, it is possible to integrate electrical cabinets such as system cabinets 126 or electrical cores 128.

Likewise, it is possible to organize these various electrical cabinets so as to clear at the level of the junction between the cabin 124 and the nose cone containing the cockpit 122 at least one accessible connection centre 94, generally one on each side of the aircraft, improving the comfort of the operators responsible for the installation or the servicing of the electrical network of the aircraft. According to this arrangement, the electrical network of the cabin is linked by virtue of connection means to the electrical network of the nose cone of the aircraft, these connection means being disposed at the level of the connection centre or centres 94. Thus, it is possible to integrate the electrical network of the cabin independently of the electrical network of the cockpit and to subsequently link them at the level of an accessible connection zone.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the present disclosure in any way. Rather, the foregoing detailed description will provide those skilled in the art with a convenient road map for implementing an exemplary embodiment, it being understood that various changes may be made in the function and arrangement of elements described in an exemplary embodiment without departing from the scope of the present disclosure as set forth in the appended claims and their legal equivalents.

What is claimed is:

1. An electrical cabinet of an aircraft, comprising:
    at least one motherboard having a first face and a second face, and including on the first face sockets into which are plugged PCB boards ensuring one or more electrical functions, the electrical cabinet being linked to an electrical circuit of the aircraft organized as various electrical harnesses by way of an electrical connection system,
    wherein the electrical connection system comprises at the level of the second face of the motherboard at least one additional layer, a free face of the at least one additional layer comprising sockets each ensuring electrical connection with an electrical harness of the aircraft, the at least one additional layer comprising tracks which make it possible to reorganize the electrical circuits emanating from the sockets intended for the PCB boards so as to render them compliant with the sockets intended for the electrical harnesses of the aircraft.

2. The electrical cabinet according to claim 1, wherein the at least one motherboard further comprises several motherboards disposed vertically one above another.

3. The electrical cabinet according to claim 2, wherein the several motherboards are provided at the level of the rear face of the electrical cabinet.

4. The electrical cabinet according to claim 3, further comprising rails at the rear of the electrical cabinet to hold the electrical harnesses of the aircraft vertically.

5. An electrical cabinet for an aircraft having a plurality of electrical harnesses, the electrical cabinet comprising:
    at least one motherboard having a first face with at least one first socket and a second face opposite the first face, wherein each of the at least one first sockets is configured to receive a PCB board for providing one or more electrical functions; and
    an electrical connection system configured to link the at least one first socket with the plurality of electrical harnesses, the electrical connection system having an additional layer for each of the plurality of electrical harnesses at the second face, each additional layer including a second socket and a track interconnecting the first and second sockets establishing an electrical connection therebetween, wherein an electrical circuit can be selectively established between the first socket and at least one of the plurality of electrical harnesses for rendering the PCB board compliant with an intended electrical harness of the aircraft.

6. The electrical cabinet according to claim 5, wherein the at least one motherboard further comprises a plurality of motherboards arranged vertically one above another in the electrical cabinet.

7. The electrical cabinet according to claim 6, wherein each of the plurality of motherboards is arranged at a rear face of the electrical cabinet.

8. The electrical cabinet according to claim 7, further comprising at least one rail arranged at the rear of the electrical cabinet and configured to vertically position each of the plurality of the electrical harnesses with respected to the electrical cabinet.

\* \* \* \* \*